(12) United States Patent
Galburt

(10) Patent No.: US 7,042,554 B2
(45) Date of Patent: *May 9, 2006

(54) REMOVABLE RETICLE WINDOW AND SUPPORT FRAME USING MAGNETIC FORCE

(75) Inventor: Daniel N. Galburt, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/166,392

(22) Filed: Jun. 27, 2005

(65) Prior Publication Data

US 2005/0231707 A1    Oct. 20, 2005

Related U.S. Application Data

(63) Continuation of application No. 10/692,822, filed on Oct. 27, 2003, now Pat. No. 6,912,043.

(60) Provisional application No. 60/438,765, filed on Jan. 9, 2003.

(51) Int. Cl.
*G03B 27/58* (2006.01)
*G03B 27/62* (2006.01)
*G03F 9/00* (2006.01)

(52) U.S. Cl. .............................. 355/75; 355/72; 430/5

(58) Field of Classification Search ................ 355/72, 355/75; 430/5
See application file for complete search history.

(56) References Cited

U.S. PATENT DOCUMENTS 4,833,051 A    5/1989    Imamura

| 6,239,863 B1 | 5/2001 | Catey et al. |
| 6,492,067 B1 | 12/2002 | Klebanoff et al. |
| 6,912,043 B1 | 6/2005 | Galburt |
| 2002/0154285 A1 | 10/2002 | Ramamoorthy et al. |
| 2002/0155359 A1 | 10/2002 | Muzio et al. |
| 2003/0231092 A1 | 12/2003 | Sabau |

FOREIGN PATENT DOCUMENTS

| JP | 11-044947 | 2/1999 |
| WO | WO 01/40870 | 6/2001 |

OTHER PUBLICATIONS

European Search Report from European Appl. No. 04 00 0177, 3 pages.
English Abstract for Japanese Patent Publication No. 63071853, 1 page.
English Abstract for Japanese Patent Publication No. 05019452, 1 page.
Singapore Search Report from Singapore Appl. No. 200400064-2, 6 pages.
English Abstract for Japanese Patent Publication No. 06-236022, publication date Aug. 23, 1994, 1 page.
English Abstract for Japanese Patent Publication No. 11-044947, publication date Feb. 16, 1999, 7 pages.

(Continued)

*Primary Examiner*—Rodney Fuller
(74) *Attorney, Agent, or Firm*—Sterne, Kessler, Goldstein & Fox P.L.L.C.

(57) ABSTRACT

An apparatus for maintaining an optical gap between a pellicle and a reticle in a photolithography system includes a frame defining first and second opposing surfaces, a reticle mated to the first opposing surface using magnetic coupling and a pellicle mated to the second opposing surface using magnetic coupling.

20 Claims, 9 Drawing Sheets

OTHER PUBLICATIONS

English Abstract for Japanese Patent Publication No. 11295880 A, publication date Oct. 29, 1999, 1 page.

REMOVABLE RETICLE WINDOW AND SUPPORT FRAME USING MAGNETIC FORCE

CROSS-REFERENCE TO RELATED APPLICATIONS

This application is a continuation of U.S. appl. Ser. No. 10/692,822, filed Oct. 27, 2003 (that issued as U.S. Pat. No. 6,912,043 on Jun. 28, 2005), which claims priority to U.S. Provisional Patent Application No. 60/438,765, Filed: Jan. 9, 2003, Titled: REMOVABLE RETICLE WINDOW AND SUPPORT FRAME USING MAGNETIC FORCE, which are incorporated by reference herein in their entireties.

BACKGROUND OF THE INVENTION

1. Field of the Invention

The present invention is generally related to photolithography systems, and more particularly, to ways of mounting reticles and pellicles.

2. Related Art

In the fabrication of integrated circuits, photolithographic and projection printing techniques are used. In photolithography, an image contained on a reticle is projected onto a wafer having a photosensitive resist thereon. The reticle or mask is used to transfer a desired image onto the silicon wafer. The semiconductor wafer surface is coated with photosensitive resist so that an image is etched thereon. A pellicle may be used in combination with the reticle to protect the reticle surface from damage, and to prevent debris from distorting the image. The pellicle is traditionally mounted on a solid frame to the reticle.

Some wavelengths of light used in photolithography are sensitive to absorption by atmospheric oxygen. Hence, when such oxygen-sensitive light wavelengths are used in photolithography, they must be transmitted through an oxygen-purged atmosphere.

A photolithography system is typically located in a clean room environment. In some situations, the ambient atmosphere of the clean room cannot be purged of oxygen because this may cause other problems with the photolithography process. For instance, a laser interferometer used in a lithography system may be sensitive to changes in the index of refraction of the air, which may occur with a change to an oxygen-free atmosphere. Hence, the oxygen-free environment may have to be restricted to less than the entire lithography system. What is needed is a transmission medium for light wavelengths that have high absorption in an oxygen-containing environment.

A pellicle is generally mounted on a frame opposite a corresponding reticle. Hence, an air gap may exist between the reticle and pellicle. Also, there are no known membrane materials that can be used to protect the patterned reticle surface from particle contamination at the 157 nm exposure wavelength. At present, the preferred alternative is using a thin fused silica window spaced from the reticle by a frame. Typically the frame is bonded both to the reticle and window. Alternately, if both the window and frame are fused silica, and the mating surfaces are sufficiently flat, the reticle, frame and window could be "contacted" together without cement depending on molecular forces to hold the surfaces together. However, the problem of attaching the reticle, pellicle and frame together in an easy manner remains.

SUMMARY OF THE INVENTION

The present invention is directed to a removable reticle window and support frame using magnetic force that substantially obviates one or more of the problems and disadvantages of the related art.

An embodiment of the present invention comprises an apparatus for maintaining an optical gap between a pellicle and a reticle in a photolithography system including a frame defining first and second opposing surfaces, a reticle mated to the first opposing surface using magnetic coupling. A pellicle is mated to the second opposing surface using magnetic coupling.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

"Ambient air" means an oxygen-containing atmosphere, such as normal atmospheric air. For instance, "ambient air" may mean air in an oxygen-containing clean room atmosphere or environment.

"Purge gas" means a gas that does not contain oxygen, or some other undesired gas, and is used to fill a purged air gap or space.

Figure 1:
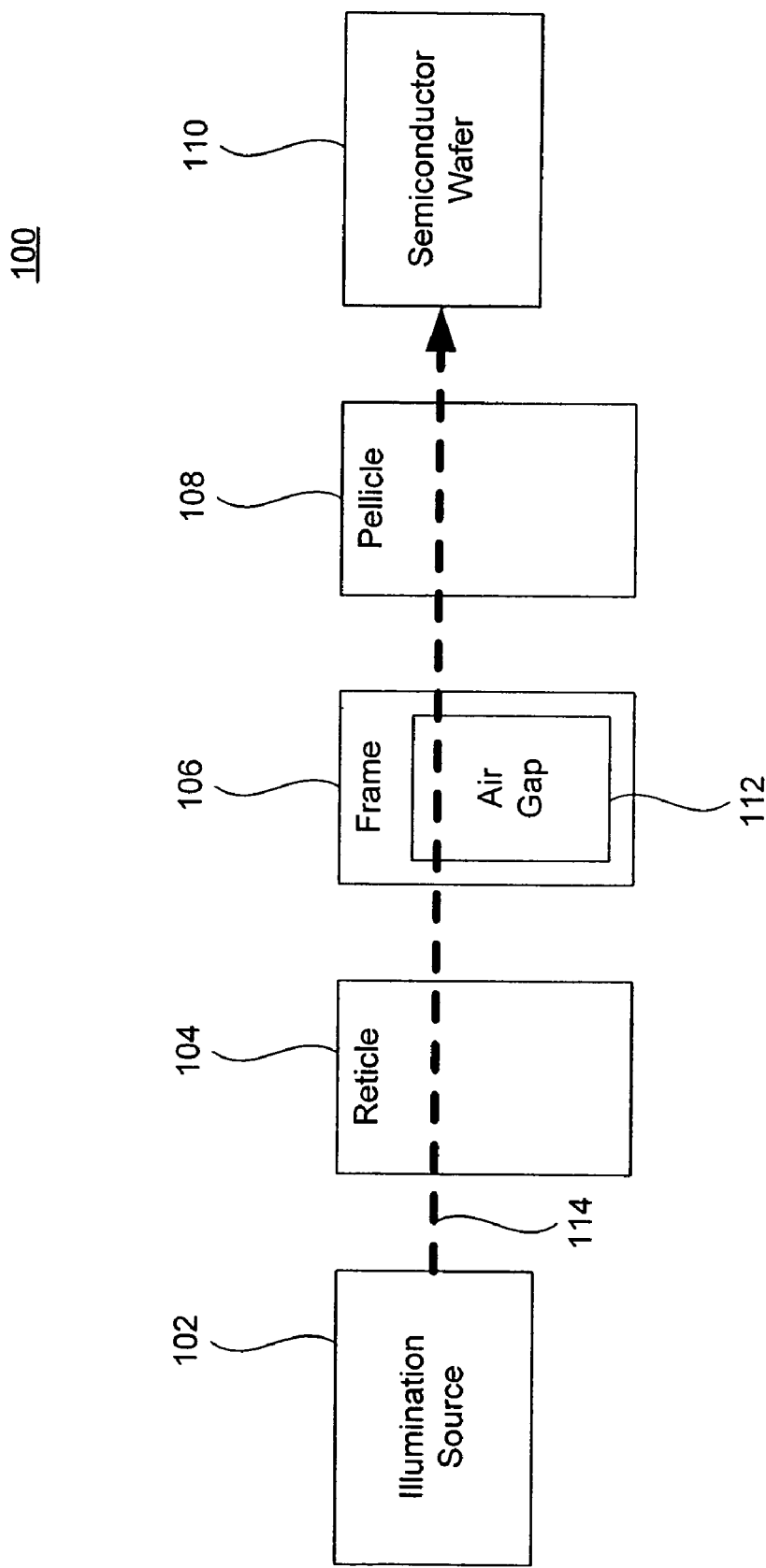
FIG. 1 illustrates a block diagram of the relevant portion of the optical path of a conventional lithography system.

FIG. 1 illustrates a relevant portion of a conventional photolithography system 100. Conventional photolithography system 100 is located in an ambient air or gas environment. Some portions of a conventional photolithography system may not be shown in FIG. 1 for purposes of brevity, such as source optics, projection optics, etc.

Conventional photolithography system 100 comprises an illumination source 102, a reticle 104, a frame 106, a pellicle 108, and a semiconductor wafer 110. Illumination source 102 includes a source of radiation for exposing a surface of semiconductor wafer 110 with a pattern on reticle 104. Reticle 104 includes a mask with a pattern that is transferred to a surface of semiconductor wafer 110 by radiation from illumination source 102. Frame 106 is a conventional solid frame to which the reticle and pellicle are attached. Frame 106 comprises an air gap 112. Air gap 112 is formed within frame 106 between reticle 104 and pellicle 108. Pellicle 108 is a clear cover for protecting reticle 104 from particulate damage.

Semiconductor wafer 110 is a semiconductor wafer with a surface to be exposed and etched by radiation from illumination source 102 with a pattern from reticle 104.

Illumination source 102 produces radiation 114. Radiation 114 is transmitted through reticle 104, frame 106, air gap 112, and pellicle 108, to a surface of semiconductor wafer 110. When radiation 114 includes light wavelengths that are absorbed by oxygen, oxygen in air gap 112 may absorb at least a portion of these wavelengths, potentially preventing a sufficient amount of radiation 114 from reaching the surface of semiconductor wafer 110. This absorption may lead to an inadequate amount of radiation transferring the pattern of reticle 104 to the surface of semiconductor wafer 110, leading to reduced semiconductor wafer yields.

Figure 2:
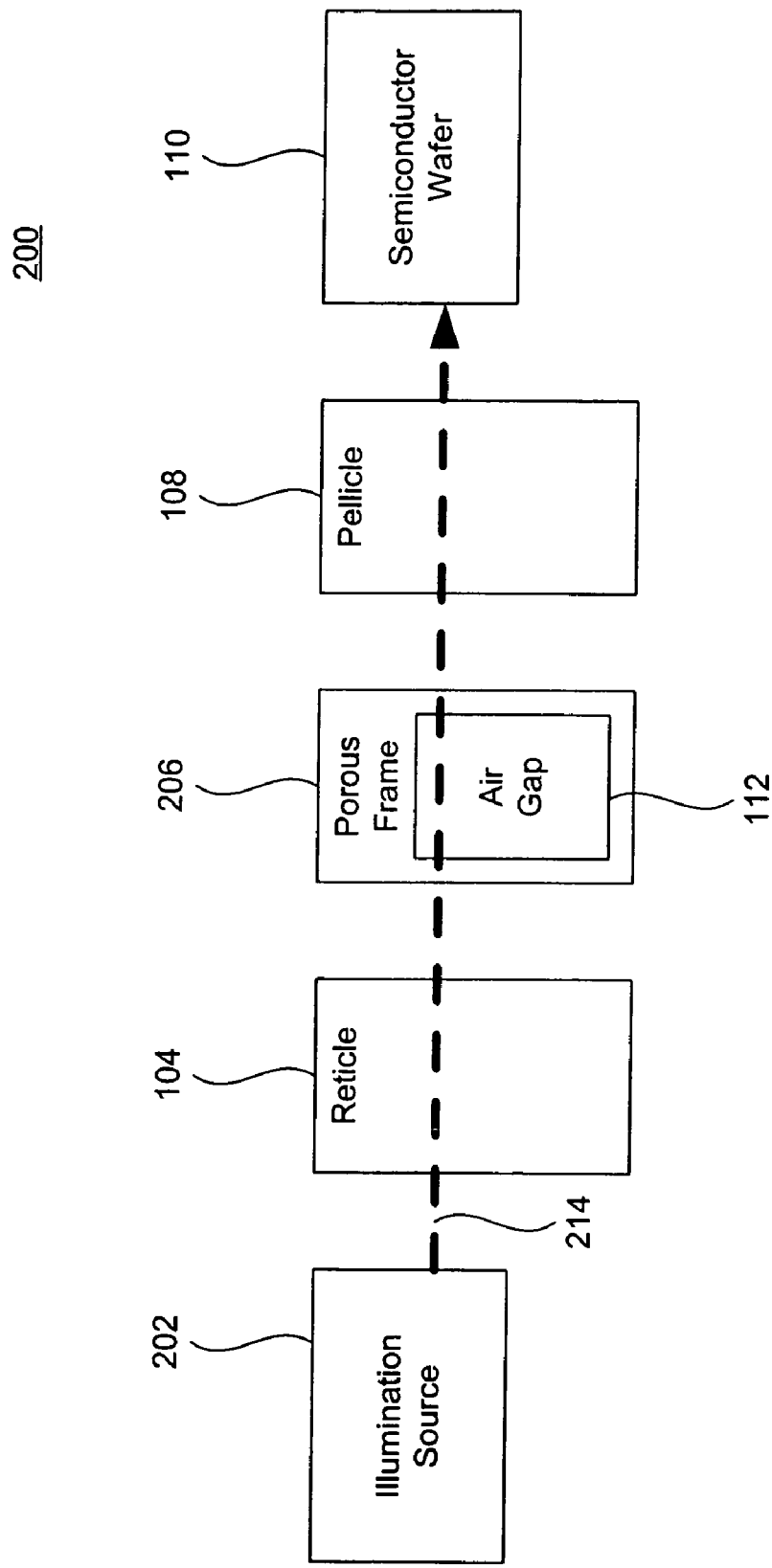
FIG. 2 illustrates a block diagram of the relevant portion of the optical path of a lithography system of the current invention.

FIG. 2 illustrates an exemplary photolithography system 200, according to an embodiment of the present invention. Photolithography system 200 is located in an ambient air environment. Photolithography system 200 maintains a purge gas environment between a reticle and a pellicle for transmission of light wavelengths that are sensitive to oxygen.

Photolithography system 200 comprises an illumination source 202, a reticle 104, a porous frame 206, a pellicle 108, and a semiconductor wafer 110.

Illumination source 202 includes a source of radiation for exposing a surface of semiconductor wafer 110. Illumination source 202 may include any applicable source of radiation suitable for exposing a semiconductor wafer surface, including a laser. Illumination source 202 transmits radiation 214. Radiation 214 may include any type of suitable radiation, including laser light. Radiation 214 may include oxygen-sensitive light wavelengths suitable for exposing and etching a semiconductor wafer. Such light wavelengths may include 157 nm wavelength light, for example.

Reticle 108 receives radiation 214. Reticle 104 includes a mask with a pattern that is transferred to a surface of semiconductor wafer 110 by radiation 214 from illumination source 202.

Porous frame 206 receives radiation 214 that has passed through reticle 108. Reticle 108 is attached to porous frame 206. Porous frame 206 comprises a porous material that allows gas to flow through, but blocks passage of particle contaminants.

Pellicle 108 receives radiation 214 that has passed through porous frame 206. Pellicle 108 is attached to porous frame 206. Reticle 104 is in optical alignment with pellicle 108.

Radiation 214 is transmitted through reticle 104, porous frame 206, purged air gap 112, and pellicle 108 to semiconductor wafer 110. Semiconductor wafer 110 receives radiation 214. Semiconductor wafer 110 comprises a surface to be exposed and etched with a pattern of reticle 104 by radiation 214 transmitted by illumination source 202.

Porous frame 206 encloses air gap 112. Air gap 112 is formed within porous frame 206 between reticle 104 and pellicle 108. Air gap 112 is filled with a purge gas, such as nitrogen, that does not contain oxygen, and hence does not interfere with oxygen-sensitive wavelengths of radiation 214. Porous frame 206 further prevents particulate contamination from entering air gap 112 and damaging reticle 104. Porous frame 206 has sufficient porosity to allow gas to pass from air gap 112 enclosed by porous frame 206 to an exterior of porous frame 206.

Because porous frame 206 allows gas to flow in and out, in a static mode, porous frame 206 normalizes pressure within air gap 112 with atmospheric pressure, eliminating distortion to reticle 104 and/or pellicle 108. See also U.S. Pat. No. 6,239,863, and U.S. patent application Ser. No. 10/314,491, filed Dec. 9, 2002, which are both incorporated by reference herein.

Lithography system 200 provides a purge gas optical path for radiation 214 from illumination source 202. Hence, illumination source 202 may transmit oxygen-sensitive light wavelengths, without suffering from significant attenuation caused by oxygen absorption.

The reticle with purged pellicle-to-reticle gap of the present invention is described above in an example photolithography environment. The present invention is not limited to such an environment, and is applicable to additional photolithography environments, and non-photolithography environments. The example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary embodiments for a reticle with purged pellicle-to-reticle gap according to the present invention are described below. These embodiments are described herein for illustrative purposes, and are not limiting. The present invention is adaptable to any application requiring a reticle with purged pellicle-to-reticle gap.

Figure 3:
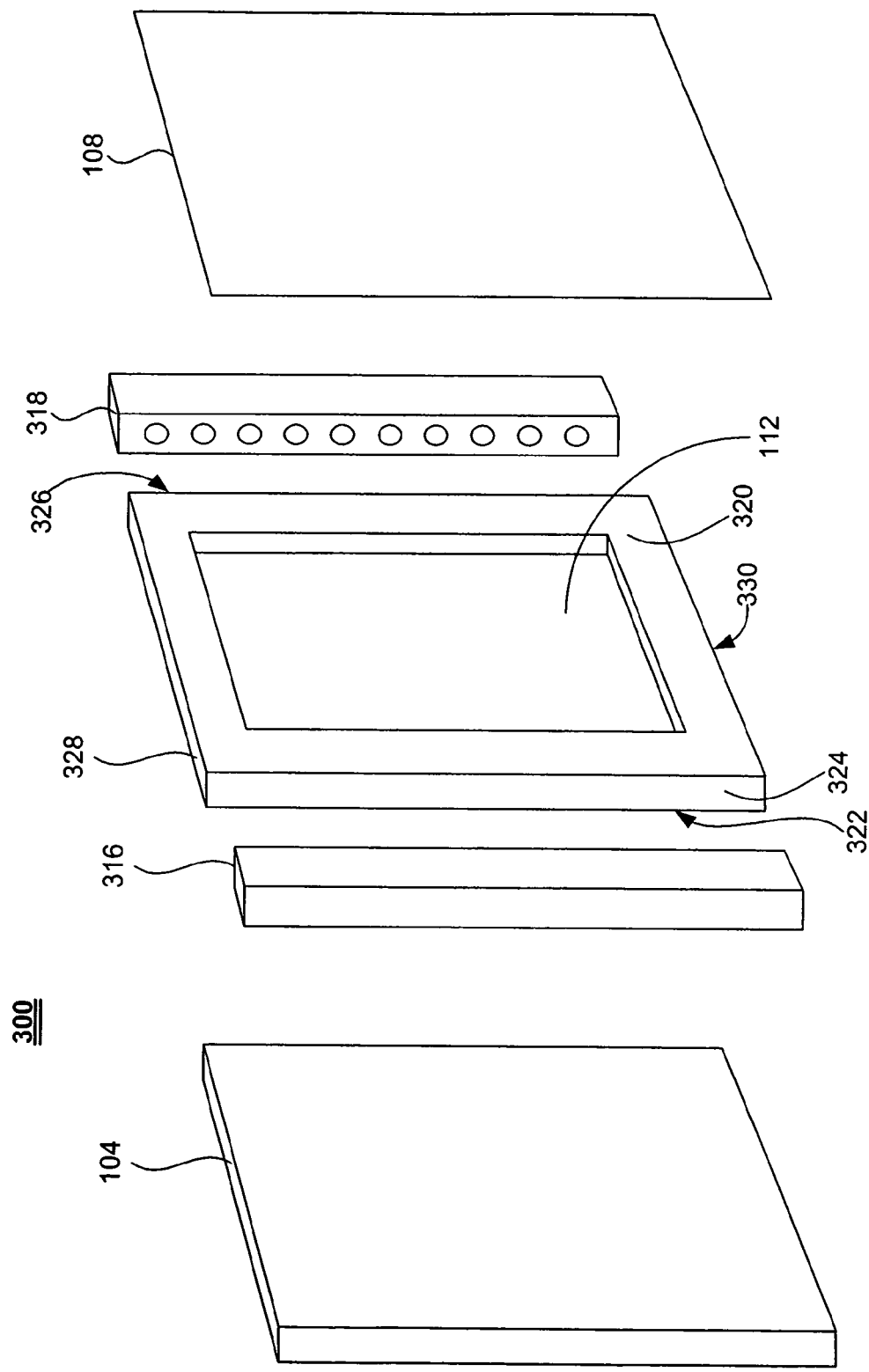
FIG. 3 illustrates an exploded view of a reticle and pellicle assembly with porous frame, according to an embodiment of the present invention.

FIG. 3 illustrates an exploded view of an exemplary purged pellicle-to-reticle gap system 300, according to an embodiment of the present invention. Purged pellicle-to-reticle gap system 300 comprises a reticle 104, a porous frame 206, a pellicle 108, an air gap 112, a purge gas supply interface 316, and a vacuum source interface 318.

Porous frame 206 comprises a first surface 320 and a second surface 322 (located on opposite side of porous frame 206 from first surface 320, not visible in FIG. 3). First surface 320 and second surface 322 are substantially parallel to one another. Porous frame 206 is comprised of a porous filtering material. The porous filtering material of porous frame 206 allows the transmission of gases, but prevents the transmission of particles. These particles may include particles in the air, dust, particles resulting from the photolithography process, and particles resulting from other sources. In a preferred embodiment, porous frame 206 is substantially rectangular. In alternate embodiments, porous frame 206 may comprise other shapes, such as circular, elliptical, and irregular.

In a preferred embodiment, porous frame 206 is manufactured from one or more metals. For example, porous frame 206 may comprise iron, copper, bronze, nickel, titanium, or other metal, or any combination or alloy thereof.

Porous frame 206 comprises pores formed in the metal(s) by a pore forming process. For example, porous frame 206 may be made from metal powder particles or filaments bonded at their contact points by sintering, which may create a continuous, well-defined network of pores between the particles or filaments. Sintering techniques generally weld together and grow a contact area between two or more initially distinct particles at temperatures below the melting point. Other processes for forming pores are also within the scope of the present invention. The porosity, or pore size, may be controlled by the production process, and may be determined on an application-by-application basis. For example, the porosity may be specified in microns, or in fractions of a micron. The invention, however, is not limited to these porosity values. A number of vendors can potentially supply suitable porous metals that are manufactured according to sintering and other techniques. Such vendors may include GKN Sinter Metals, in Auburn Hills, Mich., and Capstan Permaflow, Inc., in Gardena, Calif.

Pellicle 108 is coupled to first surface 320 of porous frame 206. Pellicle 108 may comprise a glass, a membrane, or other material, as would be known to persons skilled in the relevant art(s) (although at the present time, there are difficulties using membranes at 157 nm). Pellicle 108 is attached or affixed to first surface 320 such that air gap 112 is completely enclosed at first surface 320. Furthermore, pellicle 108 is attached to first surface 320 such that a substantially air tight seal is formed at the interface of pellicle 108 and first surface 320.

Reticle 104 is coupled to second surface 322 of porous frame 206. Reticle 104 is attached or affixed to second surface 322 such that air gap 112 is completely enclosed at second surface 322. Furthermore, reticle 104 is attached to second surface 322 such that a substantially air tight seal is formed at the interface of reticle 104 and second surface 322. Reticle 104 and second surface 322 are attached in a manner well known to persons skilled in the relevant art(s).

Pellicle 108, reticle 104, and porous frame 206 combine to form a substantially air tight air gap 112, where gases flow only through the material of porous frame 206. In a preferred embodiment, the porous filtering material of porous frame 206 is capable of allowing transmission of a gas while simultaneously blocking the entrance of particulate contamination.

The "breathable" porous frame 206 assembly with reticle 104 and pellicle 108 may either be allowed to remain static (i.e., open to the surrounding environment), or be coupled to an external pressurized purge gas source as described above. Purge gas supply interface 316 interfaces porous frame 206 with a purge gas supply. Purge gas supply interface 316 connects to a first frame end surface 324 of porous frame 206. Purge gas supply interface 316 preferably provides a purge gas from a purge gas supply to first frame end surface 324. The purge gas infuses from purge gas supply interface 316 into air gap 112 through the pores of first frame end surface 324. In an alternative embodiment, purge gas supply interface 316 is a first port, hole, or valve in porous frame 206 for providing purge gas through porous frame 206 and into air gap 112.

Vacuum source interface 318 interfaces porous frame 206 with a vacuum source. Vacuum source interface 318 connects to a second frame end surface 326 of porous frame 206. As shown in FIG. 3, second frame end surface 326 is located on the opposite side of porous frame 206 from first frame end surface 324 (not visible in FIG. 3). In alternate embodiments, second frame end surface 326 may be located on sides of porous frame 206 that are not opposite first frame end surface 324. Vacuum source interface 318 preferably evacuates or removes the purge gas from air gap 112 through the pores of second frame end surface 326. In an alternative embodiment, vacuum source interface 318 is a second port, hole, or valve in porous frame 206 for evacuating or removing purge gas more directly from air gap 112.

In normal operation, porous frame 206 has four exposed outer surfaces: first frame end surface 324, second frame end surface 326, a third frame end surface 328, and a fourth frame end surface 330 (opposite of third frame end surface 328, not visible in FIG. 3). In a preferred embodiment, all exposed outer surfaces of porous frame 206 are porous, and allow gas to pass into and out from air gap 112. In alternative embodiments, first frame end surface 324 and second frame end surface 326 are the only exposed outer surfaces of porous frame 206 that are porous. This is especially useful in dynamic uses of the present invention, allowing porous frame 206 to be coupled to a purge gas source and vacuum source at first frame end surface 324 and second frame end surface 326, respectively, with no remaining exposed surfaces to leak gas.

Purge gas may enter the assembly via purge gas supply interface 316, and be evacuated from the assembly via vacuum source interface 318 to create a continuous flow of purge gas through air gap 112. The purge gas flow through air gap 112 is balanced to be equal to atmospheric pressure, to eliminate distortion to reticle 104 and/or pellicle 108.

Exemplary embodiments of a reticle with purged pellicle-to-reticle gap of the present invention are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Exemplary operational and/or structural implementations related to the structure(s), and/or embodiments described above are presented in this section. These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 4:
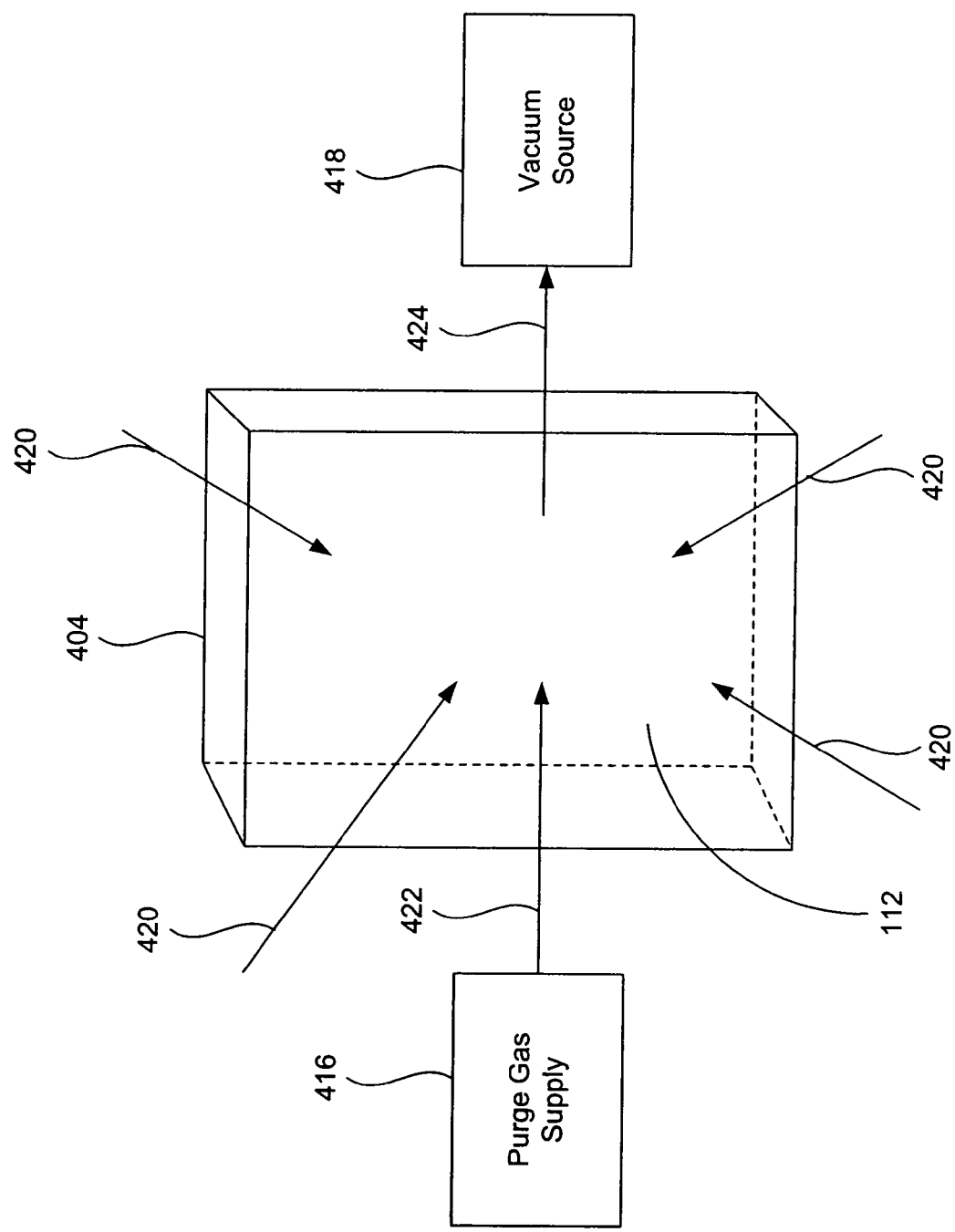
FIG. 4 illustrates operation of an exemplary embodiment of the present invention.

FIG. 4 illustrates operation of an exemplary embodiment of the present invention. FIG. 4 shows a porous frame reticle/pellicle assembly 404, a purge gas supply 416, and a vacuum source 418.

In a preferred embodiment, porous frame reticle/pellicle assembly 400 comprises a reticle, a porous frame, and a pellicle, such as reticle 104, porous frame 206, and pellicle 108 shown in FIG. 3. Porous reticle/pellicle assembly 400 further comprises an air gap 112.

In a preferred embodiment, porous frame reticle/pellicle assembly 404 maintains mechanical particulate control on a critical surface of the reticle, while allowing a continuous purge gas or air environment flow in air gap 112. Furthermore, porous reticle/pellicle assembly 400 normalizes the pressure within air gap 112, effectively eliminating distortion of either the reticle or pellicle due to atmospheric pressure changes.

In embodiments, the porous filtering material of porous frame 206 is capable of allowing transmission of a gas while simultaneously blocking the entrance of particulate contamination. This "breathable" porous frame reticle/pellicle assembly 400 may be allowed to remain static (i.e., open to the surrounding environment). In a static embodiment, porous frame reticle/pellicle assembly 400 is not coupled to a purge gas supply 416 or a vacuum source 418. Ambient air may be allowed to enter air gap 112 through porous frame reticle/pellicle assembly 400, as in example ambient air flow paths 420. However, in a preferred embodiment described below, a continuous flow of purge gas is injected into air gap 112 to prevent ambient air from entering air gap 112.

Porous frame reticle/pellicle assembly 400 may also operate in a dynamic environment. In a dynamic embodiment, porous frame reticle/pellicle assembly 400 may be coupled to a purge gas supply 416. Purge gas supply 416 supplies a purge gas through a porous frame of porous frame reticle/pellicle assembly 400 to air gap 112. The purge gas entering air gap 112 is shown as inserted purge gas flow 422. Suitable gas supply systems for purge gas supply 416 are well known in the art.

Furthermore in a dynamic embodiment, porous frame reticle/pellicle assembly 400 may be coupled to a vacuum source 418. Vacuum source 418 removes purge gas and/or ambient environment gas (if present) from air gap 112 through a porous frame of porous frame reticle/pellicle assembly 400. Purge gas being removed from air gap 112 is shown as removed gas flow 424. Suitable vacuum systems for use as vacuum source 418 are well known in the art.

Figure 5:
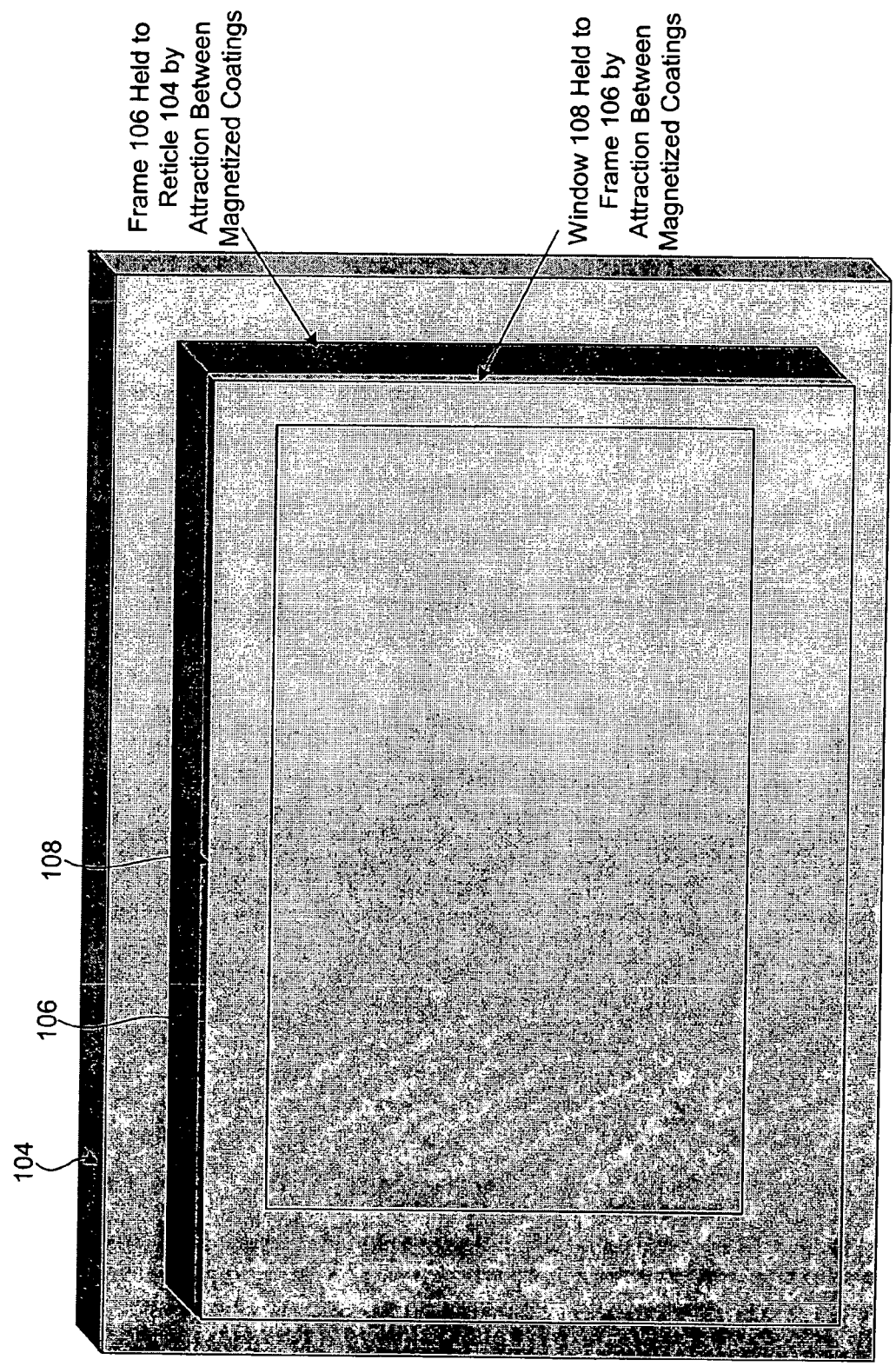
FIG. 5 shows another view of the reticle-frame-pellicle arrangement.

FIG. 5 shows another illustration of the one embodiment of the present invention. As shown in FIG. 5, the frame 106 is joined to the reticle 104 and the pellicle 108 using magnetic coupling generated, for example, by magnetic coatings. Note that a typical thickness of the pellicle, commonly made of fused silica glass for use at 157 nanometers, is about 0.8 mm. As further shown in FIG. 5, the center area (pattern area) of the reticle 104 and the pellicle 108 is usually devoted to the reticle pattern (or in the case of the pellicle 108, is clear). The typical dimensions of the center area are roughly 100 mm by 120 mm. Typical dimensions of the overall reticle 104 and pellicle 108 is approximately 150 mm square. The "dark area" around the center pattern area may be used to deposit magnetic coatings on the reticle 104 and the pellicle 108. A high magnetic permeability coating may be deposited on the frame 106, so as to couple to the high $H_C$ materials that form the coatings on the reticle 104 and the pellicle 108. In this context, a high $H_C$ material is one with a value of intrinsic cohesive force of at least 1,000 oersteds, and more preferably at least 5,000 or 10,000 oersteds.

Note that the use of a porous frame 106 is not a requirement of the invention, and a solid (e.g., fused silica frame 106) may also be used, with other mechanisms utilized for purging the volume between the pellicle 108 and the reticle 104.

The strength of the coupling is essentially proportional to the square of the field strength. The high $H_C$ coating on the reticle 104 and the pellicle 108 becomes a permanent magnet once magnetized. Examples of materials that may be used for the high $H_C$ coating include ceramic ferrites, barium ferrite, nickel alloys, neodymium-iron-boron alloys, samarium cobalt and samarium cobalt alloys, aluminum nickel alloys, alloys of vanadium, alloys of cobalt, alloys of nickel-vanadium-cobalt, and the like, as would be apparent to a person of ordinary skill in the art.

The coating on the frame 106 is preferably made of a high magnetic permeability material, such that it carries a high flux without saturating, and maintains a high magnetic flux when magnetized. Thus, a magnetic circuit is formed between the high $H_C$ material and the high permeability coating. Examples of high permeability material include soft iron and alloys of soft iron, and nickel-iron alloys. For purposes of this discussion, high permeability refers to being able to carry a magnetic flux density of preferably at least a 1,000 gauss with a permeability of at least 10, and preferably at least 100.

Figure 6A:
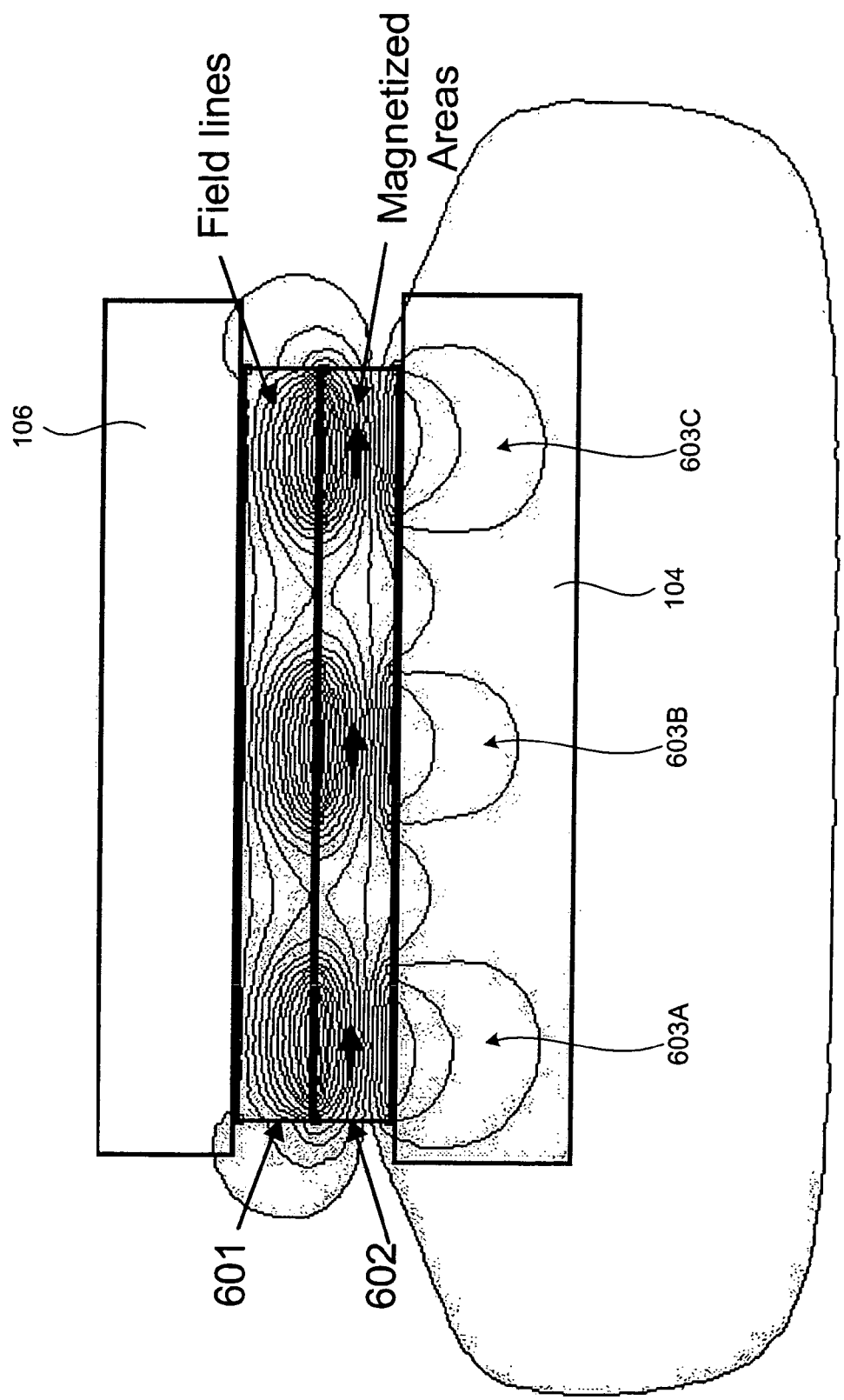
FIGS. 6A–6B show one embodiment of the magnetic coupling of the present invention.
Figure 6B:
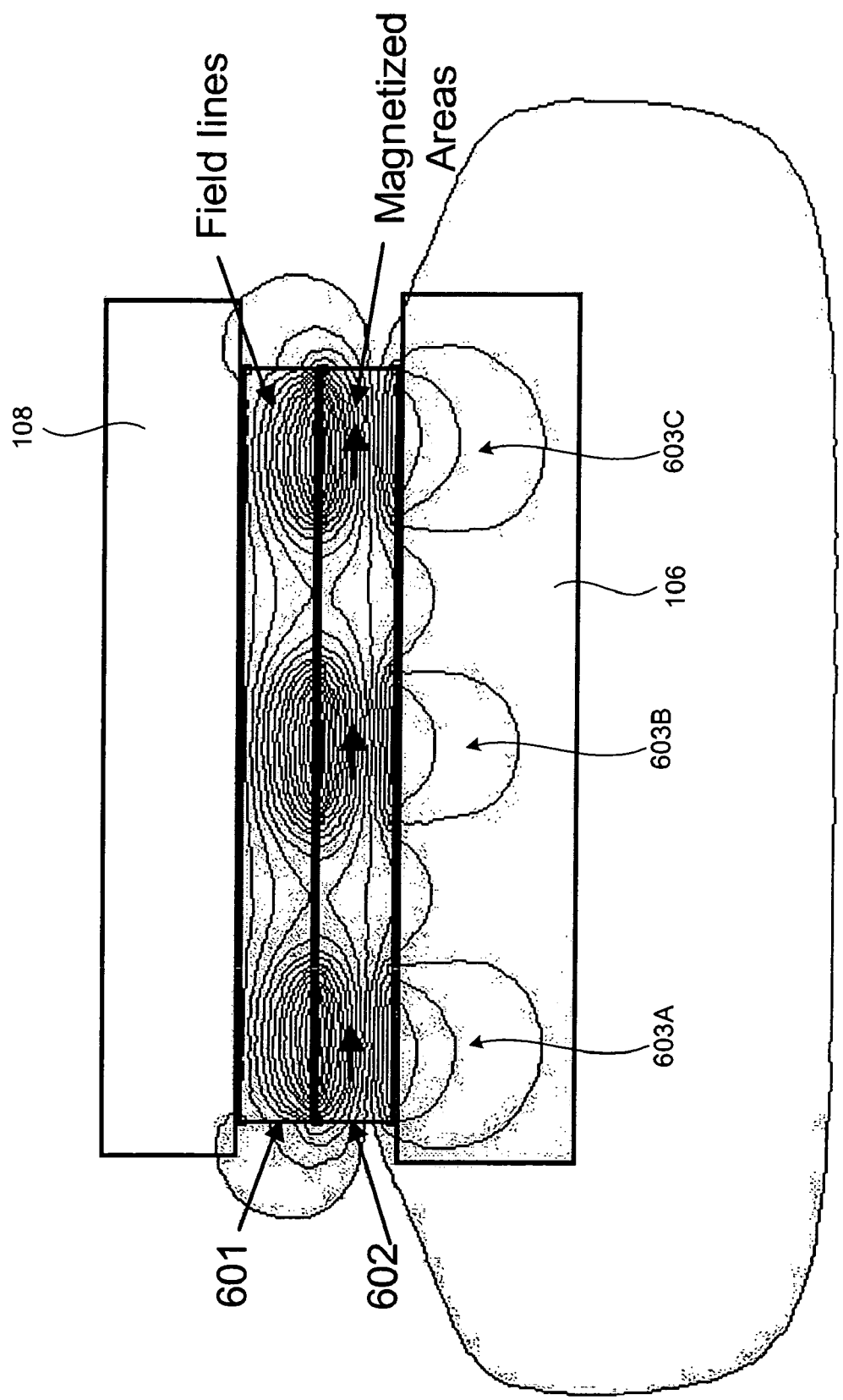

FIG. 6A illustrates a magnetic circuit formed by the high permeability coating 601 and the high $H_C$ coating 602, the coatings placed as discussed above on the reticle 104 and the frame 106. Similarly, FIG. 6B illustrates the high $H_C$ coating 602 placed on the frame 106, and the high permeability coating 601 placed on the pellicle 108. It will be appreciated that the coatings 601 and 602 in both figures can be reversed as far as their relative arrangement.

As may be further seen in FIGS. 6A and 6B, the high $H_C$ coating 602 includes a plurality of magnetized regions 603A, 603B, 603C, such that in combination with the high permeability coating 601, magnetic circuits are formed. The high $H_C$ coating 602 should preferably be magnetized with a high spatial frequency pattern of alternating field directions. Typical dimensions of the regions 603 should be such that the lateral dimension is of the same order of magnitude as the thickness of the coating 602. Thus, for a 0.5 micron thick coating 602, the lateral dimension (width) of the regions 603 should be preferably no more than a few microns.

Figure 7A:
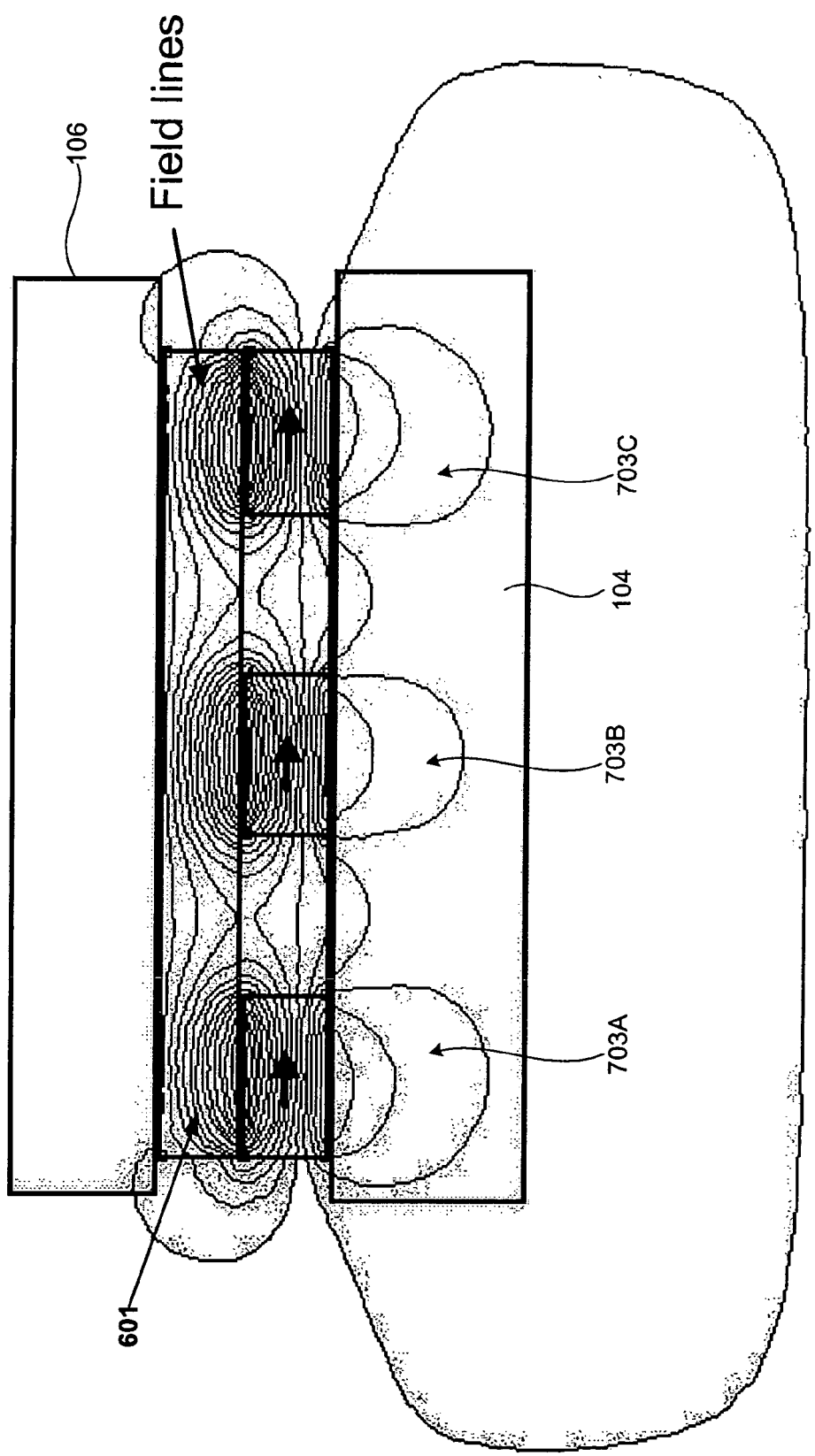
FIGS. 7A–7B show another embodiment of the magnetic coupling of the present invention.
Figure 7B:
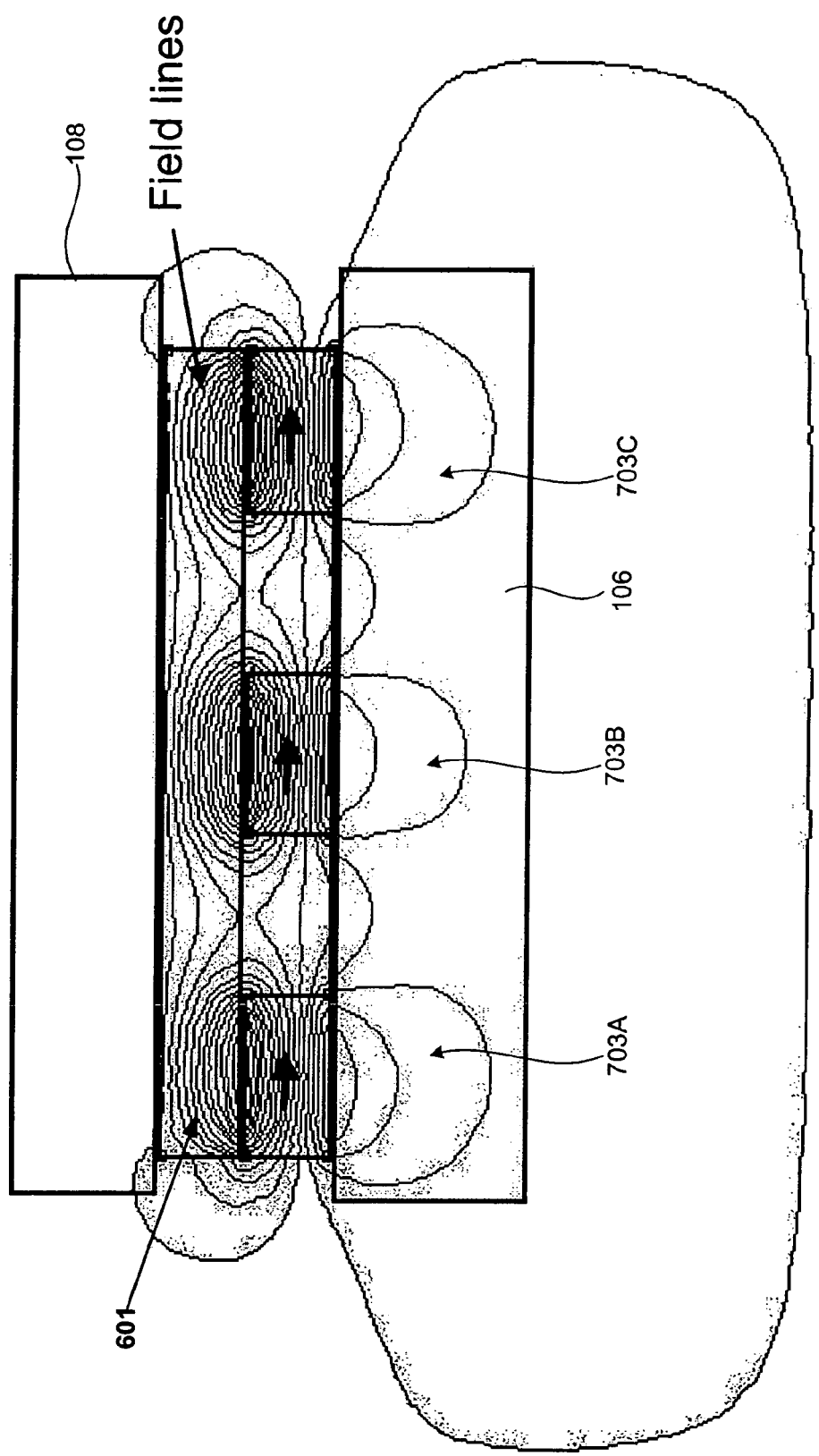

FIGS. 7A and 7B are similar to FIGS. 6A and 6B, but illustrate an embodiment where the high $H_C$ coating has been patterned into "strips" 703A, 703B, 703C. Thus, instead of alternating regions of high magnetization (603 in FIGS. 6A and 6B), the space between the "strips" 703 in FIGS. 7A and 7B is left empty.

It will also be appreciated that hysteresis, which is related to the high $H_C$ property, also helps in maintaining alignment, because the magnetic coupling prevents the elements from sliding relative to each other. The magnetic coupling allows the use of raised points (or ridges in the joints), thereby relieving coupling moments at the joints (the location of the coupling of the frame 106, the pellicle 108 and the reticle 104), resulting in reduced distortion.

Another advantage of the present invention is that the elements may be taken apart and put together very easily, with minimal force required.

The assembly process is relatively quick, and easily reversible. Since the magnetic force acts at some distance, slightly raised points or ridges may be used to minimize moment coupling at interfaces between the reticle 104, frame 106 and pellicle 108.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An apparatus, comprising:
   a frame having first and second opposing surfaces;
   a reticle magnetically coupled to the first opposing surface; and
   a pellicle magnetically coupled to the second opposing surface, wherein at least one of the reticle or the pellicle include a high Hc coating having a thickness of less than about one micron.

2. The apparatus of claim 1, wherein at least one of the first opposing surface and second opposing surface includes a high magnetic permeability coating.

3. The apparatus of claim 2, wherein the high magnetic permeability coating includes one of soft iron, nickel-iron, and a nickel-iron alloy.

4. The apparatus of claim 2, wherein the high magnetic permeability coating carries a magnetic flux of at least 1,000 gauss and maintains a permeability of at least 100 at 1,000 gauss.

5. The apparatus of claim 2, wherein at least one of the reticle or the pellicle includes the high Hc coating outside a pattern area for coupling to the high magnetic permeability coating of the first opposing surface of the frame.

6. The apparatus of claim 1, wherein the high Hc coating includes any one of a ceramic ferrite, barium ferrite, a cobalt alloy, a nickel alloy, a vanadium alloy, a samarium cobalt alloy, samarium cobalt, an aluminum-nickel alloy, a nickel-iron alloy, a neodymium-iron-boron alloys and a vanadium-cobalt alloy.

7. The apparatus of claim 1, wherein the high Hc coating includes a high spatial frequency pattern of alternating field directions.

8. The apparatus of claim 1, wherein the high Hc has a value of at least 1,000 oersteds to at least 5,000 oersteds.

9. The apparatus of claim 1, wherein the high Hc coating is patterned into strips.

10. The apparatus of claim 1, wherein the frame includes a permanent embedded magnet.

11. An apparatus, comprising:
a frame;
a reticle magnetically coupled to a first side of the frame; and
a pellicle magnetically coupled to a second side of the frame,
wherein at least one of the reticle or the pellicle include a high Hc coating having a thickness of less than about one micron.

12. The apparatus of claim 11, wherein at least one of the first side or the second side includes a high magnetic permeability coating.

13. The apparatus of claim 12, wherein the high magnetic permeability coating includes any one of soft iron, nickel-iron, and a nickel-iron alloy.

14. The apparatus of claim 12, wherein the high magnetic permeability coating carries a magnetic flux of at least 1,000 gauss and maintains a permeability of at least 100 at 1,000 gauss.

15. The apparatus of claim 12, wherein at least one of the pellicle or the reticle includes the high Hc coating outside a pattern area for coupling to the high magnetic permeability coating of the first side of the frame.

16. The apparatus of claim 11, wherein the high Hc coating includes any one of a ceramic ferrite, barium ferrite, a cobalt alloy, a nickel alloy, a vanadium alloy, a samarium cobalt alloy, samarium cobalt, an aluminum-nickel alloy, a nickel-iron alloy, a neodymium-iron-boron alloys and a vanadium-cobalt alloy.

17. The apparatus of claim 11, wherein the high Hc coating includes a high spatial frequency pattern of alternating field directions.

18. The apparatus of claim 11, wherein the high Hc has a value of at least about 1,000 oersteds to at least about 5,000 oersteds.

19. The apparatus of claim 11, wherein the high Hc coating is patterned into strips.

20. The apparatus of claim 11, wherein the frame includes a permanent embedded magnet.

* * * * *